(12) United States Patent
Kamatala et al.

(10) Patent No.: US 7,103,501 B2
(45) Date of Patent: Sep. 5, 2006

(54) SYSTEM AND METHOD FOR ANALYZING DESIGN TOLERANCES

(75) Inventors: Mahesh Kamatala, Holland, MI (US); Robert Gardner, Holland, MI (US); Debajit Guha, Holland, MI (US); Hwei-Min Lu, Zeeland, MI (US); Erik Salisbury, Holland, MI (US); Raj Verma, Holland, MI (US); Ashish Gandhi, Holland, MI (US)

(73) Assignee: Varatech Engineering Consultants, Holland, MI (US)

( * ) Notice: Subject to any disclaimer, the term of this patent is extended or adjusted under 35 U.S.C. 154(b) by 720 days.

(21) Appl. No.: 10/059,695

(22) Filed: Jan. 29, 2002

(65) Prior Publication Data

US 2004/0015871 A1    Jan. 22, 2004

Related U.S. Application Data

(60) Provisional application No. 60/264,928, filed on Jan. 29, 2001.

(51) Int. Cl.
*G06F 15/00* (2006.01)
*G06F 19/00* (2006.01)
*G06F 17/50* (2006.01)

(52) U.S. Cl. .................. 702/179; 700/109; 703/1

(58) Field of Classification Search ............... 702/19, 702/127, 179, 194, 195, 196, 199; 703/7, 703/17, 1; 700/159, 179, 97, 109; 714/733; 716/5, 6; 717/126, 137
See application file for complete search history.

(56) References Cited

U.S. PATENT DOCUMENTS

| | | | | |
|---|---|---|---|---|
| 5,301,118 A | * | 4/1994 | Heck et al. ................. | 700/109 |
| 5,323,333 A | * | 6/1994 | Johnson ....................... | 703/1 |
| 5,691,909 A | * | 11/1997 | Frey et al. .................. | 700/159 |
| 5,949,693 A | * | 9/1999 | Tandler ....................... | 703/1 |
| 5,956,251 A | * | 9/1999 | Atkinson et al. ........... | 700/109 |

\* cited by examiner

*Primary Examiner*—Michael Nghiem
*Assistant Examiner*—John Le
(74) *Attorney, Agent, or Firm*—King & Partners, PLC (57) ABSTRACT

A computer program apparatus for analyzing design tolerances having a computer readable medium and computer program instructions. The computer program instructions are recorded on the computer readable medium and are executable by a processor. The computer program instructions are capable of performing the steps of facilitating the graphical identification by a user of a first and a second entity, identifying any objects related to the first and second entities, storing the identified dimensions and tolerances relating to the identified objects, and, analyzing the stored dimensions, to, in turn, determine the interfacing of the objects relative to each other.

5 Claims, 6 Drawing Sheets

SYSTEM AND METHOD FOR ANALYZING DESIGN TOLERANCES

CROSS-REFERENCE TO RELATED APPLICATIONS

This application claims the benefit of co-pending U.S. Provisional application Ser. No. 60/264,928 filed Jan. 29, 2001, the entire disclosure of which is hereby incorporated by reference. This application likewise incorporates by reference the entire disclosure of U.S. Provisional Application Ser. No. 60/352,24 filed Jan. 29, 2002.

BACKGROUND OF THE INVENTION

1. Field of the Invention

This invention relates in general to Computer Aided Design (CAD) software, and more particularly, to a software program capable of identifying tolerances of design objects, and facilitating the analysis and interfacing thereof.

2. Background Art

The use of CAD software for purposes of design and development of various products has quickly become a standard tool for the development and design of all types of products. While such design and development tools have provided the designer or engineer with a plurality of functional advantages over traditional pencil and paper design and development, there are additional software features which would be advantageous.

In particular, current methods of determining the interfacing of parts relative to their tolerances requires in-depth knowledge of structural analysis and mathematics. As such, certain specific skills are required to analyze certain structures and the interfaces between certain structures. Moreover, due to the sophistication of the calculations, such an analysis is often prone to the generation of errors. Such errors have far-reaching effects, as a faulty analysis can often lead to the redesign of components, or, an undesirably high reject rate of components at the manufacturing and assembly stage.

In turn, it would be desirable to provide for a software program which can facilitate the identification of relevant dimensions and tolerances with minimal input from a user. For example, it would be highly desirable for a user to graphically identify the components of a particular design from which the system can determine the relevant dimensions and tolerances of interest. In addition, it would be desirable to analyze the identified dimensions and tolerances under a variety of algorithms.

Accordingly, it is an object of the invention to provide a software program and corresponding apparatus which can implement the above-identified desirable features.

The foregoing object and other objectives of the present invention will become apparent in light of the specification, drawings and claims appended hereto.

SUMMARY OF THE INVENTION

The invention comprises a computer program apparatus for analyzing design tolerances. The program apparatus includes a computer readable medium and computer program instructions. The computer program instructions are recorded on the computer readable medium and executable by a processor. The computer program instructions are capable of performing the steps of facilitating the graphical identification by a user of a first and a second entity, identifying any objects related to the first and second entities, storing the identified dimensions and tolerances relating to the identified objects, and, analyzing the stored dimensions, to, in turn, determine the interfacing of the objects relative to each other.

In a preferred embodiment of the invention, the step of facilitating graphical identification comprises the steps of facilitating the movement of a identifier over a plurality of entities, and, facilitating the selecting of each of the first and second entities from the plurality of entities.

In another preferred embodiment of the invention, the step of identifying comprises the steps of identifying a first object related to the first entity, subsequently identifying a subsequent object related to the first object, repeating the step of subsequently identifying wherein for each repetition, the subsequent object becomes the first object, until the subsequent object is related to the second entity. In such an embodiment, the step of storing further comprising the step of storing at least one dimension and tolerance for each of the first object and each subsequent object.

In another preferred embodiment of the invention, the step of analyzing comprises at least one of the steps of applying a worst case scenario tolerance algorithm; applying a root sum square (rss) algorithm; applying a modified root sum square (MRSS) algorithm; applying a process centering root sum square (PCRSS) algorithm; or applying a Monte Carlo algorithm.

In yet another preferred embodiment, the step of identifying all objects related to the first and second entities comprises the steps of identifying an object related to the first entity; identifying a dimension and tolerance related to the first entity, wherein the dimension and tolerance includes a start and an end and wherein the start of the dimension corresponds to the first entity; determining whether the end of the dimension and tolerance corresponds to the second entity, wherein if the step of determining returns a negative response, then further including the steps of equating the first entity with the end of the dimension and tolerance; and repeating the above identified steps of identifying, determining. In such an embodiment, the step of storing the identified dimensions and tolerances relating to the identified objects further comprises the step of storing each of the dimensions and tolerances from each of the identified objects, to, in turn, identify and store a loop of dimensions and tolerances from the first entity to the second entity.

In yet another preferred embodiment, the step of facilitating comprises the step of facilitating the graphical identification of a single item and identifying one end of the single item as the first entity and the second end of the single item as the second entity.

In another aspect of the invention, the invention further comprises a computer program apparatus. In such an apparatus, the computer program instructions are capable of performing the steps of facilitating the graphical identification by a user of a first and a second entity, identifying at least one loop of dimensions and tolerances of a plurality of objects proceeding from the first entity to the second entity, storing the identified dimensions and tolerances relating to the at least one loop, and, analyzing the stored dimensions and tolerances relating to the at least one loop, to, in turn, determine the interfacing of the objects relative to each other.

In one embodiment of the invention, the at least one loop comprises a plurality of loops.

In another embodiment of the invention, the step of identifying further comprises the step of sequentially identifying objects from the first entity to the second entity.

In yet another aspect of the invention, the step of analyzing comprises at least one of the steps of applying a worst case scenario tolerance algorithm; applying a root sum square (RSS) algorithm; applying a modified root sum square (MRSS) algorithm; applying a process centering root sum square (PCRSS) algorithm; or applying a Monte Carlo algorithm.

In another aspect of the invention, the invention comprises a method of analyzing design tolerances. The method comprises the steps of facilitating the graphical identification by a user of a first and a second entity; identifying any objects related to the first and second entities; storing the identified dimensions and tolerances relating to the identified objects; and analyzing the stored dimensions, to, in turn, determine the interfacing of the objects relative to each other.

In yet another aspect of the invention, the invention comprises a method of analyzing design tolerances. The method comprises the steps of facilitating the graphical identification by a user of a first and a second entity; identifying at least one loop of dimensions and tolerances of a plurality of objects proceeding from the first entity to the second entity; storing the identified dimensions and tolerances relating to the at least one loop; and analyzing the stored dimensions and tolerances relating to the at least one loop, to, in turn, determine the interfacing of the objects relative to each other.

BEST MODE FOR PRACTICING THE INVENTION

While this invention is susceptible of embodiment in many different forms, there is shown in the drawings and will be described in detail, one specific embodiment with the understanding that the present disclosure is to be considered as an exemplification of the principles of the invention and is not intended to limit the invention to the embodiment illustrated.

Figure 1:
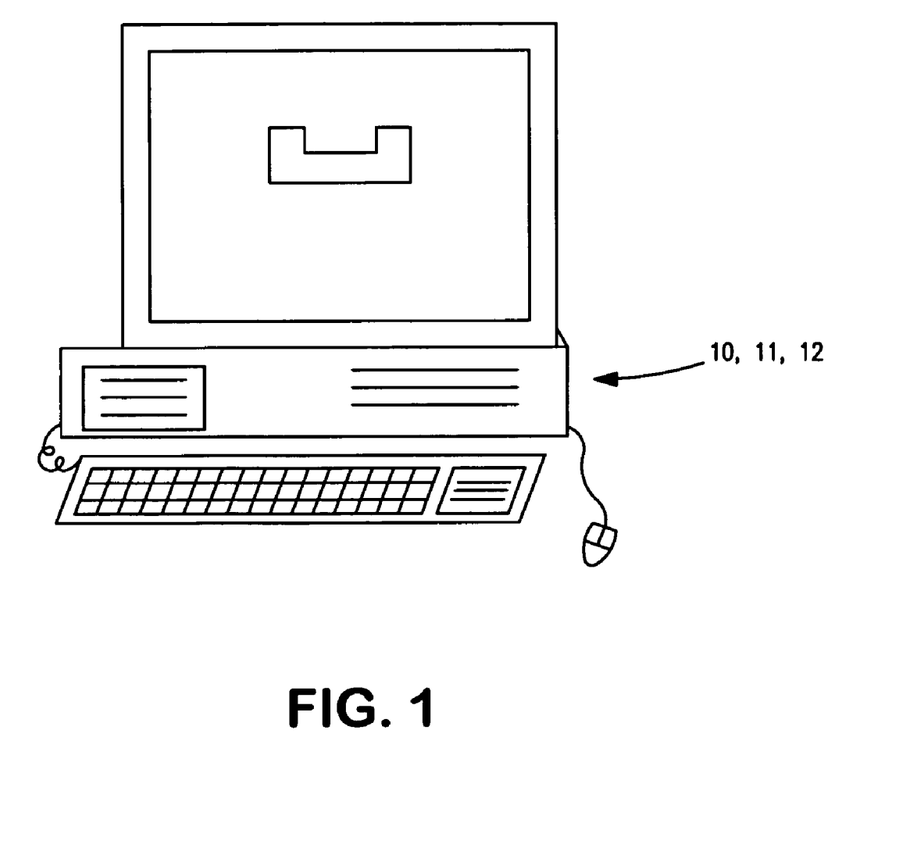
FIG. 1 of the drawings is a pictorial representation of a computer program apparatus of the present invention.

Referring now to the Figures, and in particular, to FIG. 1, the present invention comprises computer program apparatus 10 which includes computer program instructions (i.e., software) 11 capable of performing the methodology and steps identified and explained in detail below on a computing device, such as computer 12. Indeed the software of the present invention is configured to run in association with (or as a plug-in to) a specialized or conventionally available CAD program, such as SolidWorks, for example. Of course, the principles of the invention can be implemented in association with other CAD type programs (AutoCad, ADAMS, etc.) or as a stand alone software program.

With respect to hardware, it is contemplated that the software program will operate in association with personal computers operating under a windows (95, 95, ME, NT, 2000, XP) environment. Any such computer 12 will generally include a processor, a computer readable medium (RAM, flash memory, magnetic drives, optical drives, etc), an input device (i.e., keyboard, mouse, etc.) and an output device (monitor, printer, etc.). Of course, the software is not limited to operation in association with any particular type of computer (i.e., Macintosh, Intel based, Sparc, etc.) or any particular type of operating system (MacOS, Linux, Sun, etc.), and clearly a variety of different configurations are contemplated.

Figure 2:
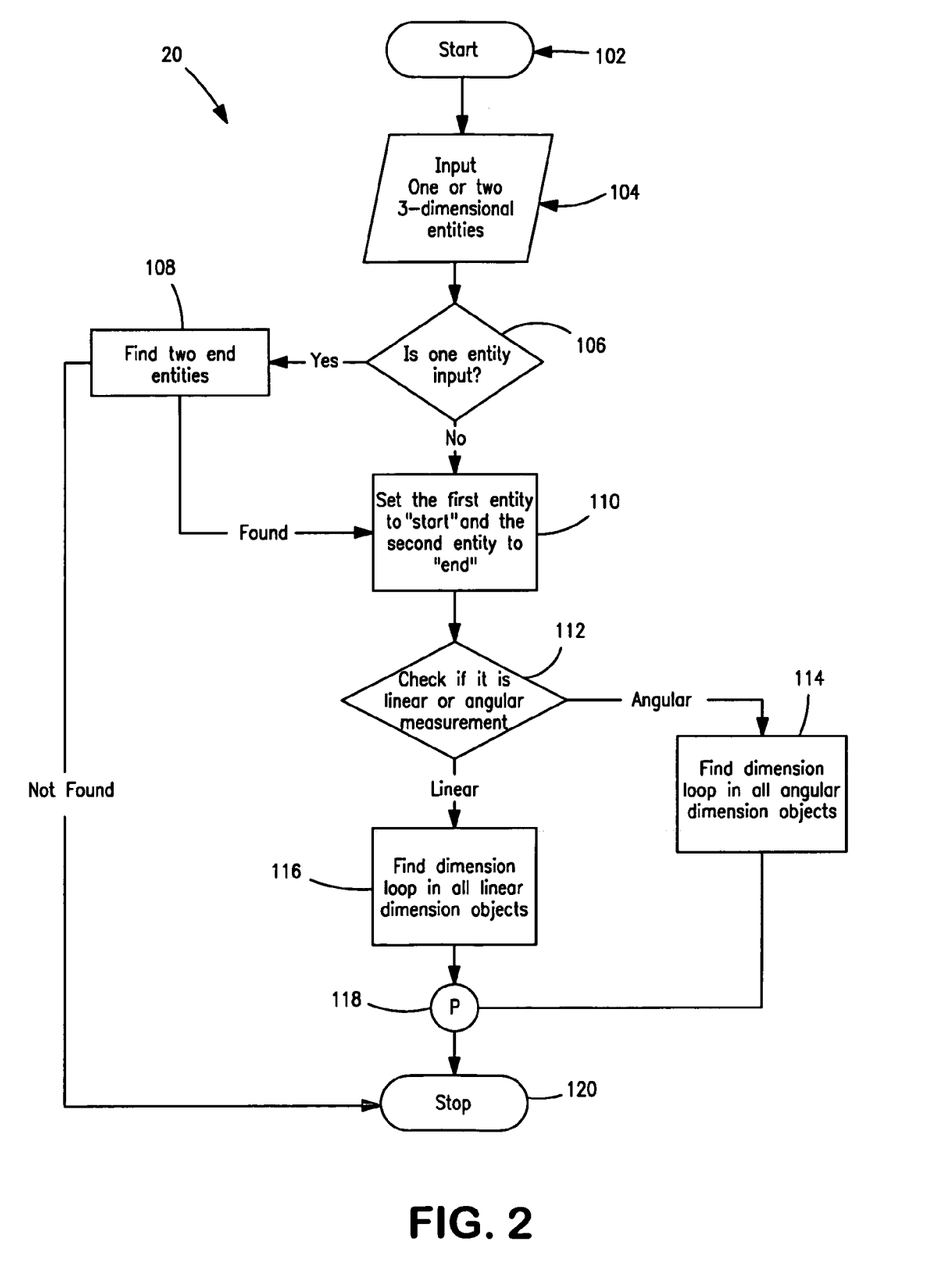
FIGS. 2–4 of the drawings are a flow chart providing one embodiment of the methodology of the computer program instructions of the present invention.
Figure 3:
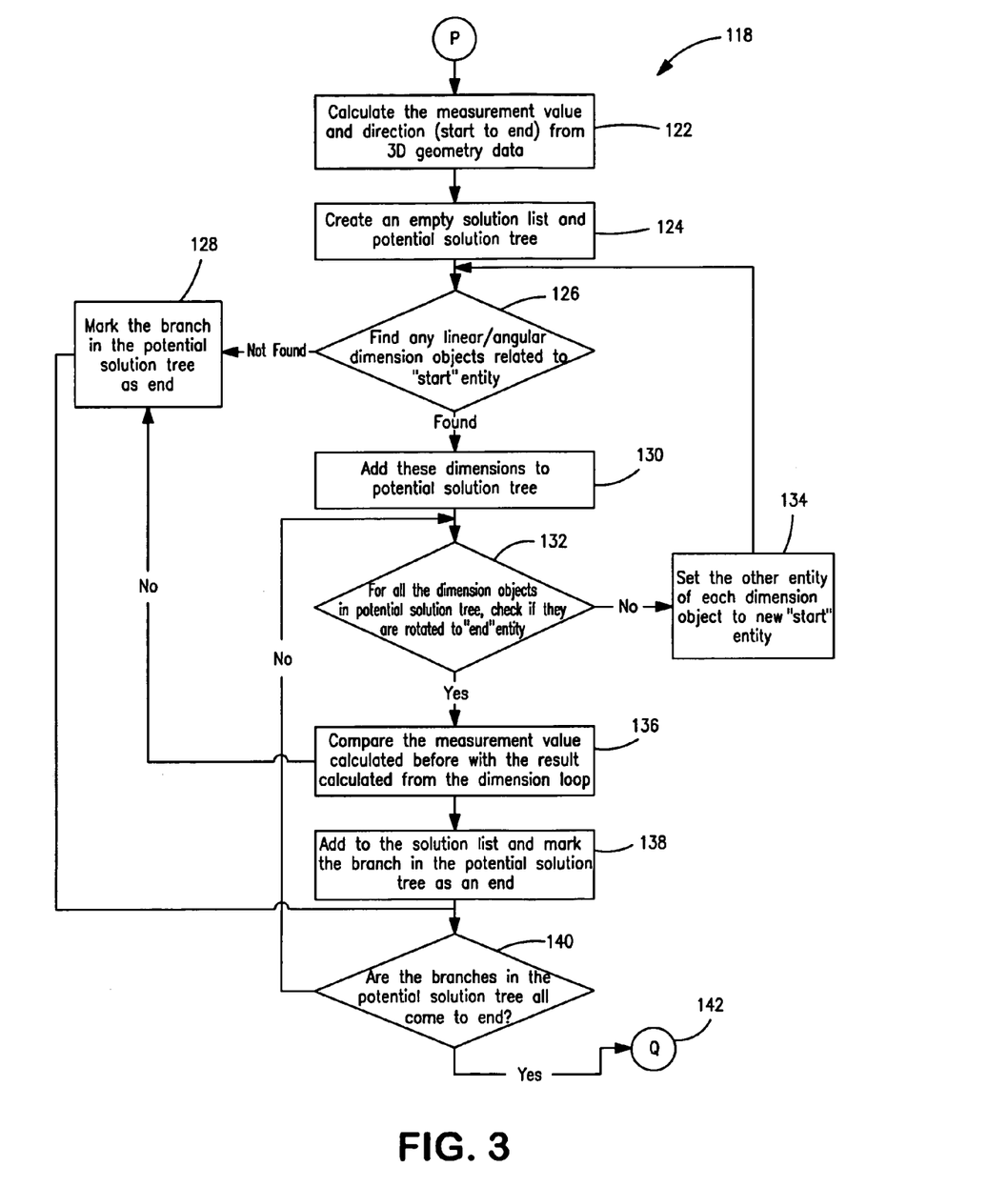
Figure 4:
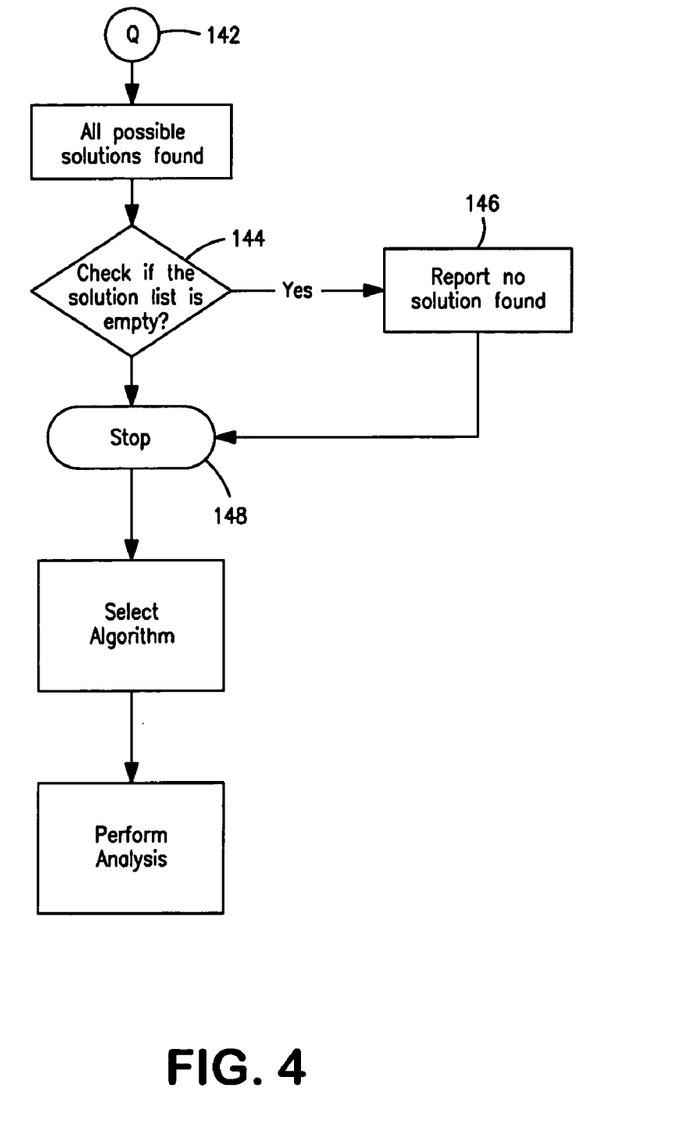

Referring now to FIGS. 2 to 4, an exemplary methodology of the present invention is shown in flow chart form generally 20. The system is first started (i.e., loaded) into the computer at step 102. Once loaded, the system is ready for the input of one or two three-dimensional (3D) entities shown generally as step 104. The selected entities for the basis for the tolerance calculations and evaluation. The particular entities that can be selected include, for example, two planar faces, one planar face and one edge (line or circular arc), one planar face and one vertex, two edges (two co-planar lines, one line and one circular arc, or two circular arcs), one edge (line or circular arc) and one vertex, two vertices, one edge (line or circular arc). Of course, it will be understood to one of skill in the art, that additional entities other than those identified above may be implemented.

At step 106, the system determines as to whether a single entity is input or whether two entities are input by the user. If a single entity is entered, at step 108, the system identifies the single entity as a single item, and then defines the first end of the single item as the first entity, and the second end of the single item as the second entity. If at step 108 the two ends of the entity cannot be determined, the system proceeds to step 120, and, in turn, the system stops.

On the other hand, if the user has identified two entities, namely, a first entity and a second entity, the system proceeds to step 110. At step 110, the system sets the first entity as "start" and the second entity "end". Alternatively, the system sets the first end as "start" and the second end as "end."

As a practical matter, the entities are selected by, for example, directing a cursor (or other identifier) on a display monitor displaying the various objects that are to be analyzed until the cursor overlies a desired object, and, subsequently selecting (or depressing the mouse button) when the cursor is in the desired position. Of course, other methods of identification are likewise contemplated in the present invention.

Next, the system determines, based upon the entity or entities selected, as to whether a linear or angular measurement is desired at step 112. Assuming that the user selected two planar faces, at step 112, the system determines as to whether the two planar surfaces are parallel or non-parallel. If the two planar surfaces are parallel, then the system will operate under the assumption that what is desired is a linear calculation. If, on the other hand, the two planar surfaces are non-parallel, then the system will operate under the assumption that what is desired is an angular calculation. For a planar face and a line, if parallel, the distance between the line and the plane is calculated; if non-parallel, the angle between the line and the plane is calculated. For a planar face and a circular arc, the distance between the center of the arc and the plane is calculated. For a planar face and one vertex, the distance between the vertex and the plane is calculated. For two co-plane lines, if parallel, the distance between the two lines is calculated, if non-parallel, the angle between the two lines is calculated. For a line and a circular arc, the distance between the center of the arc and the line is calculated. For two circular arcs, the distance between centers of the two arcs is calculated. For a line and a vertex, the distance between the vertex and the line is calculated. For a circular arc and a vertex, the distance between the vertex and the center of the arc is calculated. For two vertices, the distance between two vertices is calculated. For a single line, the dimension from end to end is calculated. The different modes of operation identified above are quite useful, as it is often difficult to graphically click on a full plane, or a difficult to reach object. In such instances, a user can click on a vertex or an edge.

Regardless, it is determined as to whether angular dimension objects are searched at step 114 or if linear dimension objects are searched at step 116. The searching of the solution is calculated in subroutine 120.

In subroutine 118, the system first calculates all measurement values and directions (start to end) from the 3D data of the drawings at step 122. At step 124, the system creates an empty solution list and a potential solution tree as a means for collecting data. The precise method of storing data is not limited to any particular data storage structure, and, in turn, one of skill in the art will be able to provide a plurality of different data acquisition and storage structures.

At step 126, the system searches for any object that is associated with the "start" entity. If no such objects are found, then the object is tentatively determined to be a possible end. If, on the other hand, an object that is related to the "start" entity is found, then step 130 adds the dimensions to the potential solution tree. Next, the system, at step 132 determines whether the object that was added to the potential solution tree is related to the "end" entity. If the object is not related to the "end" entity, then the end of the object is treated as the "start" entity for the subsequent search for a second adjacent object. In particular, the second adjacent object is sought by repeating of steps 126, 130, 132. At some point, an object will be identified as being related to the "end" entity during step 132, as the system has generally looped from the "start" to the "end." At such time, each of the objects which are related to the "start" and "end" have been identified.

Once it appears that the objects of interest have been identified, the system computes the dimension between the "start" and "end" object based upon a summation of the dimensions of the objects identified during steps 126–132. The step 136 compares the distance computed by the summation of the distances and tolerances identified between the "start" and the "end" with that which was computed during step 122. If the comparison is positive (i.e., the results are substantially identical), then the system proceeds to step 138 wherein the calculated tree or data storage structure is verified as being accurate.

Next, at step 140, the system determines as to whether any other calculations are required. For example, if a plurality of objects were connected with any of the "start" objects, then two separate branches (or loops) would be followed, a path loop proceeding from one of the start objects and a separator path loop proceeding from the other of the start objects. As such, at step 140, the system directs the repetition of step 132 and the repetition of much of subroutine 118 until such time as each different path reaches an "end".

Once all of the branches have reached an "end", then the system proceeds to subroutine 142. In particular, at step 144, the system determines as to whether a solution has been provided (i.e., as to whether the system stored any data solutions). If no solutions are provided, then a report is provided to the user which indicates that no solutions are present. If solutions are presented then the system proceeds to the completion step 148. The solutions can then be utilized for analysis.

The operation of the above-identified methodology will be described with respect to the distance between the surfaces 200, 202 shown in FIG. 5. To begin the process, the user first selects the surface 200 as the starting point and then selects the surface 202 as the end point for the analysis. As explained above, the user can direct the cursor via a pointing device such as a mouse such that it overlies first desired surface 200. Next, the user can click the mouse button to select this surface. This series of steps can be repeated for the selection of the second desired surface 202. Again, the selection process is not limited to any particular configuration or selection methodology, and, a variety of selection methods are contemplated, as long as the user can identify the desired surfaces.

Once the two surfaces are selected, the system first calculates the distance between the two objects through a conventional distance subroutine. As will be explained, this calculation is later used for calculation verification.

The system next searches for an object and corresponding dimension (generally comprising a dimension and a corresponding tolerance) which is related to the "start" surface 200. In the particular example, the system identifies a single object A and a single dimension $D_h \pm T_h$ which is defined by surface 200 and surface 210, and, in turn, stores this dimension. Next, the system assigns the surface 210 as a "start" surface and again searches for an object and corresponding dimension which is related to the newly defined "start" surface 210. The system now identifies the single object B having the single dimension $S_1 \pm T_1$ which is defined by surface 210 and 212, and, in turn, stores this dimension. Next, the system assigns the surface 212 as the "start" surface and searches for another object and corresponding dimension which is related to the "start" surface 212. In response, the system identifies single object C having the single dimension $S_2 \pm T_2$ which is defined by surfaces 212 and 202. The system then stores this dimension. As surface 202 comprises the "end" surface, the system has completed a full loop traversing all of the objects between "start" 202 and end "202".

More specifically, a user has provided a loop of dimensions and tolerances which extends from the first entity 200 to the second entity 202. It is contemplated that in certain embodiments of the invention, or in certain applications, a plurality of loops of separate dimensions and tolerances can be computed between a first entity and second entity. Such an example is shown in FIG. 6, schematically. A first loop is shown as comprising the dimensions and tolerances for each of the surfaces 300, 302, 304, 306 and 308. A second loop is shown as comprising the dimensions and tolerances for each of the surfaces 310, 306 and 308. As such, the system includes the analysis of two fully separate loops which comprise different sets of dimensions and tolerances of the different objects.

Figure 5:
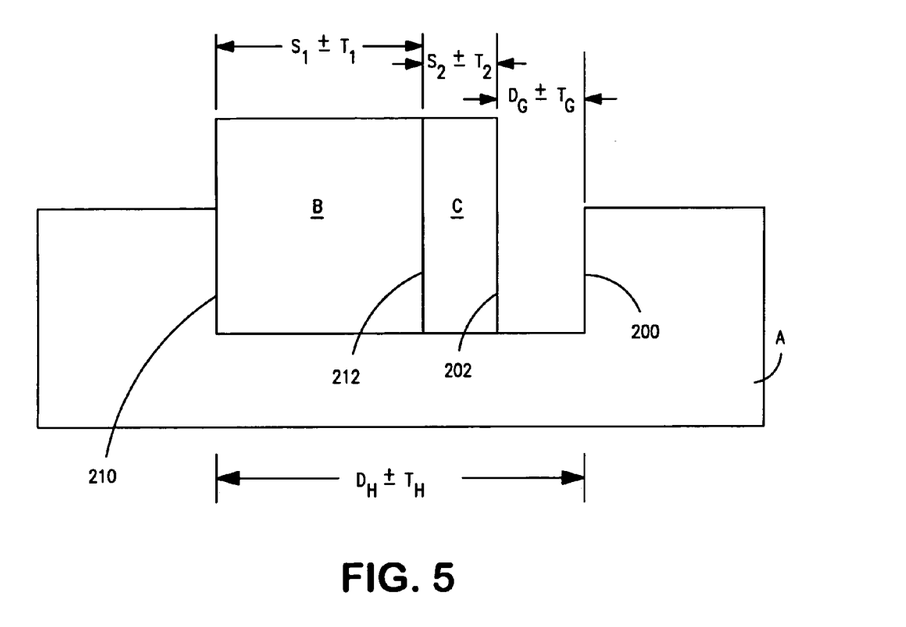
FIG. 5 of the drawings is a schematic representation of an exemplary object upon which tolerances may be analyzed.
Figure 6:
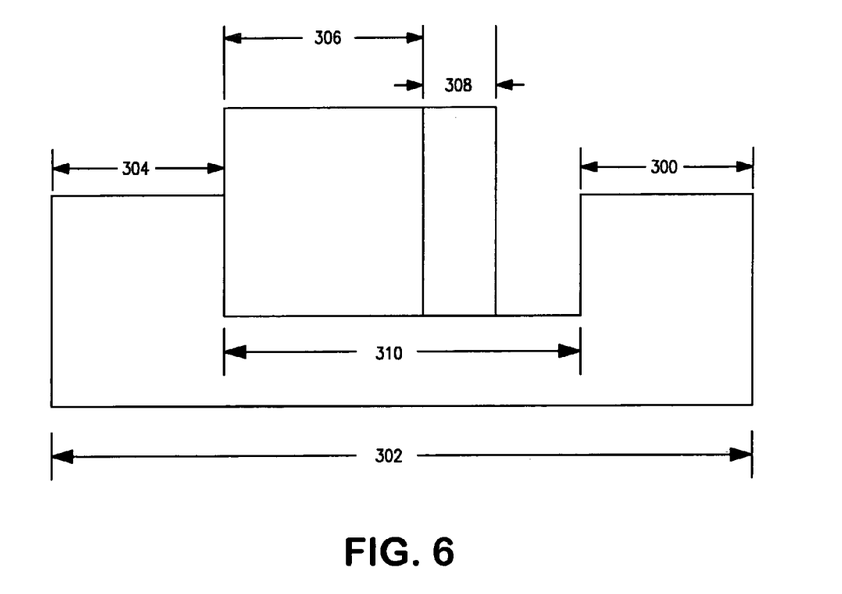
FIG. 6 of the drawings is a schematic representation of another exemplary object upon which tolerances may be analyzed, showing, in particular, two loops of dimensions and tolerances.

Returning again to the object identified in FIG. 5, once the dimensions and tolerances of the identified objects are identified and stored, the total distance between surfaces 200 and 202 is then computed by a summation of the stored distances identified by the different objects. This computation is then compared to the prior conventional calculation as a check to determine whether the two numbers correlate. If the results do not correlate, then the user is alerted to same.

After the data is stored, the system can utilize the stored data to provide various types of analysis as to the interfacing of the identified objects relative to each other and relative to the assembly based upon the tolerances. Among other analysis, the user can select analysis based upon the worst case scenario, root sum square (rss), modified root sum square (MRSS), process centering root sum square (PCRSS), or Monte Carlo algorithms. Of course, other types of evaluating algorithms are likewise contemplated for use. For example, and as will generally be understood, the worst case scenario method focuses on the boundary conditions, i.e., +t and −t conditions for each of the different objects.

As another example, the Monte Carlo algorithm takes random values in a given distribution for each of the tolerances and then adds the tolerances together. This process is repeated a plurality of times until an adequate sample size has been obtained. In addition, it will be understood that the system can be used to determine the tolerances associated with any object, or with any gap between objects.

Once the desired algorithms have been executed on the data obtained, the analysis can be provided to a user in a variety of different report formats. For example, simple tree diagrams can be provided which identify the various upper and lower tolerance limits for the objects. Further statistics reports and graphs can be generated based upon the data obtained during analysis. As such, a user can determine whether or not the various parts will fit together based on the tolerances. In addition, the user can determine the reject rate for given objects based upon the provided tolerances. It will be understood that with the system is not limited to any particular reports, or to any particular type of reports, report formats, or report parameters.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. A computer program apparatus for analyzing design tolerances comprising:
   a computer readable medium; and
   computer program instructions, recorded on the computer readable medium, executable by a processor, for performing the steps of:
      facilitating the graphical identification by a user of a first and a second entity, which comprises the steps of:
         facilitating the movement of an identifier over a plurality of entities; and
         facilitating the selecting of each of the first and second entities from the plurality of entities;
      identifying any objects related to the first and second entities;
      storing the identified dimensions and tolerances relating to the identified objects; and
      analyzing the stored dimensions, to, in turn, determine the interfacing of the objects relative to each other.

2. The computer program apparatus of claim 1, wherein the step of analyzing comprises at least one of the steps of:
   applying a worst case scenario tolerance algorithm;
   applying a root sum square (RSS) algorithm;
   applying a modified root sum square (MRSS) algorithm;
   applying a process centering root sum square (PCRSS) algorithm; and
   applying a Monte Carlo algorithm.

3. The computer program apparatus of claim 1, wherein the step of facilitating further comprises the steps of:
   facilitating the graphical identification of a single item; and
   identifying one end of the single item as the first entity and a second end of the single item as the second entity.

4. A computer program apparatus for analyzing design tolerances comprising:
   a computer readable medium; and
   computer program instructions, recorded on the computer readable medium, executable by a processor, for performing the steps of:
      facilitating the graphical identification by a user of a first and a second entity;
      identifying any objects related to the first and second entities, which comprises the steps of:
         identifying a first object related to the first entity;
         subsequently identifying a subsequent object related to the first object;
         repeating the step of subsequently identifying wherein for each repetition, the subsequent object becomes the first object, until the subsequent object is related to the second entity;
      storing at least one dimension and tolerance for each of the first object and each subsequent object; and
      analyzing the stored dimensions, to, in turn, determine the interfacing of the objects relative to each other.

5. A computer program apparatus for analyzing design tolerances comprising:
   a computer readable medium; and
   computer program instructions, recorded on the computer readable medium, executable by a processor, for performing the steps of:
      facilitating the graphical identification by a user of a first and a second entity;
      identifying any objects related to the first and second entities, which comprises the steps of:
         identifying an object related to the first entity;
         identifying a dimension and tolerance related to the first entity, wherein the dimension and tolerance includes a start and an end and wherein the start of the dimension corresponds to the first entity; and
         determining whether the end of the dimension and tolerance corresponds to the second entity, wherein if the step of determining returns a negative response, then further including the steps of:
            equating the first entity with the end of the dimension and tolerance; and
            repeating the above identified steps of identifying and determining;
      storing each of the dimensions and tolerances from each of the identified objects, to, in turn, identify and store a loop of dimensions and tolerances from the first entity to the second entity; and
      analyzing the stored dimensions, to, in turn, determine the interfacing of the objects relative to each other.

* * * * *